United States Patent
Terauchi

(10) Patent No.: US 8,289,078 B2
(45) Date of Patent: Oct. 16, 2012

(54) SEMICONDUCTOR INTEGRATED CIRCUIT AND ELECTRONIC DEVICE

(75) Inventor: Ryota Terauchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 401 days.

(21) Appl. No.: 12/690,474

(22) Filed: Jan. 20, 2010

(65) Prior Publication Data

US 2010/0225396 A1   Sep. 9, 2010

(30) Foreign Application Priority Data

Mar. 3, 2009   (JP) .................................. 2009-49434

(51) Int. Cl.
*H03F 3/45* (2006.01)
(52) U.S. Cl. ........................................ 330/257; 330/261
(58) Field of Classification Search .................. 330/257, 330/261, 253, 310
See application file for complete search history.

(56) References Cited

U.S. PATENT DOCUMENTS

| 7,385,444 B2 * | 6/2008 | Kurokawa | 330/10 |
| 7,812,647 B2 * | 10/2010 | Williams | 327/110 |
| 7,994,827 B2 * | 8/2011 | Williams | 327/110 |
| 2008/0136441 A1 | 6/2008 | Terauchi | |
| 2009/0206893 A1 | 8/2009 | Terauchi | |
| 2011/0018593 A1 * | 1/2011 | Williams | 327/109 |

FOREIGN PATENT DOCUMENTS

JP   2007142608   6/2007

\* cited by examiner

*Primary Examiner* — Henry Choe
(74) *Attorney, Agent, or Firm* — Turocy & Watson, LLP

(57) ABSTRACT

An electronic device has a manipulation part which outputs a control signal including a first analog signal and a second analog signal obtained by inverting a phase of the first analog signal; and a display part which includes a semiconductor integrated circuit supplied at an input terminal thereof with the control signal to output a signal depending upon the control signal from an output terminal thereof, and which displays a predetermined image based on the signal output from the semiconductor integrated circuit.

8 Claims, 7 Drawing Sheets

SEMICONDUCTOR INTEGRATED CIRCUIT AND ELECTRONIC DEVICE

CROSS-REFERENCE TO RELATED APPLICATION

This application is based upon and claims the benefit of priority from the prior Japanese Patent Application No. 2009-49434, filed on Mar. 3, 2009, the entire contents of which are incorporated herein by reference.

BACKGROUND OF THE INVENTION

1. Field of the Invention

The present invention relates to a semiconductor integrated circuit including a differential amplifier circuit.

2. Background Art

Some conventional semiconductor integrated circuits include a transfer gate to intercept an input signal and control timing of inputting a signal and timing of starting a differential amplifier circuit (see, for example, JP-A 2007-142608 (KOKAI)).

As a result, the conventional semiconductor integrated circuits suppress the potential variation of the input signal when differential amplification is started.

Since the conventional semiconductor integrated circuits use a delay circuit formed of an inverter chain, however, a false operation might be caused by dispersion in inverters.

SUMMARY OF THE INVENTION

According to one aspect of the present invention, there is provided: a semiconductor integrated circuit comprising:

a differential amplifier circuit which detects a potential difference between a first input signal and a second input signal obtained by inverting a phase of the first input signal, and outputs an output signal depending upon a result of the detection;

a first MOS transistor of a first conductivity type connected at a first end thereof to a power supply and diode-connected;

a constant current circuit connected between a second end of the first MOS transistor and a ground, outputting a constant current when an enable signal is at a first level, and stopping the output of the constant current when the enable signal is at a second level which is different from the first level;

a second MOS transistor of the first conductivity type connected at a first end thereof to the power supply, connected at a second end thereof to the differential amplifier circuit, and connected at a gate thereof to a gate of the first MOS transistor to supply a current obtained by conducting current mirroring on a current flowing through the first MOS transistor as an operation current of the differential amplifier circuit;

a third MOS transistor of the first conductivity type connected at a first end thereof to the power supply, connected at a second end thereof to the second end of the first MOS transistor, and supplied at a gate thereof with the enable signal to turn off when the enable signal is at the first level and turn on when the enable signal is at the second level;

a fourth MOS transistor of the first conductivity type connected at a first end thereof to the power supply and connected at a gate thereof to the second end of the first MOS transistor;

a fifth MOS transistor of a second conductivity type connected between the second end of the fourth MOS transistor and the ground and supplied at a gate thereof with an inverted signal obtained by inverting a phase of the enable signal to turn on when the inverted signal is at the first level and turn off when the inverted signal is at the second level;

an operation circuit supplied with a signal depending upon a first voltage at a node between the fourth MOS transistor and the fifth MOS transistor and the enable signal, outputting a first operation signal to output the output signal of the differential amplifier circuit to an output terminal when the enable signal is at the first level and the first voltage is at least a prescribed voltage, and outputting a second operation signal when the enable signal is at the second level or the first voltage is lower than the prescribed voltage; and an output buffer circuit supplied with the output signal of the differential amplifier circuit and a signal output by the operation circuit, outputting the output signal to the output terminal when the first operation signal is input, and outputting a signal fixed to a certain logic to the output terminal when the second operation signal is input.

According to another aspect of the present invention, there is provided: an electronic device comprising:

a manipulation part which outputs a control signal including a first analog signal and a second analog signal obtained by inverting a phase of the first analog signal; and a display part which includes a semiconductor integrated circuit and displays a predetermined image based on a signal output from the semiconductor integrated circuit, the semiconductor integrated circuit supplied at an input terminal thereof with the control signal and outputting a signal depending upon the control signal from an output terminal thereof, wherein the semiconductor integrated circuit comprising:

a differential amplifier circuit which detects a potential difference between a first analog signal and a second analog signal obtained by inverting a phase of the first analog signal, and outputs an output signal depending upon a result of the detection;

a first MOS transistor of a first conductivity type connected at a first end thereof to a power supply and diode-connected;

a constant current circuit connected between a second end of the first MOS transistor and a ground, outputting a constant current when an enable signal is at a first level, and stopping the output of the constant current when the enable signal is at a second level which is different from the first level;

a second MOS transistor of the first conductivity type connected at a first end thereof to the power supply, connected at a second end thereof to the differential amplifier circuit, and connected at a gate thereof to a gate of the first MOS transistor to supply a current obtained by conducting current mirroring on a current flowing through the first MOS transistor as an operation current of the differential amplifier circuit;

a third MOS transistor of the first conductivity type connected at a first end thereof to the power supply, connected at a second end thereof to the second end of the first MOS transistor, and supplied at a gate thereof with the enable signal to turn off when the enable signal is at the first level and turn on when the enable signal is at the second level;

a fourth MOS transistor of the first conductivity type connected at a first end thereof to the power supply and connected at a gate thereof to the second end of the first MOS transistor;

a fifth MOS transistor of a second conductivity type connected between the second end of the fourth MOS transistor and the ground and supplied at a gate thereof with an inverted signal obtained by inverting a phase of the enable signal to turn on when the inverted signal is at the first level and turn off when the inverted signal is at the second level;

an operation circuit supplied with a signal depending upon a first voltage at a node between the fourth MOS transistor and the fifth MOS transistor and the enable signal, outputting a first operation signal to output the output signal of the differential amplifier circuit to the output terminal when the enable signal is at the first level and the first voltage is at least a prescribed voltage, and outputting a second operation signal when the enable signal is at the second level or the first voltage is lower than the prescribed voltage; and an output buffer circuit supplied with the output signal of the differential amplifier circuit and a signal output by the operation circuit, outputting the output signal to the output terminal when the first operation signal is input, and outputting a signal fixed to a certain logic to the output terminal when the second operation signal is input.

DETAILED DESCRIPTION

A differential amplifier circuit detects a potential of a signal by inputting a reference potential to one input of a differential signal amplifier for amplifying a small amplitude differential signal and inputting the signal to the other input. The differential amplifier circuit is a circuit indispensable to analog circuits such as a comparator circuit.

In general, when the differential amplifier circuit is started, operating points of MOS transistors included in the differential amplifier circuit are not stable. In some cases, therefore, a signal opposite to an input signal is falsely output depending upon the input signal and external environment conditions such as the temperature and voltage.

In some cases, the output signal obtained when starting the circuit also becomes an effective signal depending upon specifications of the product. A measure for preventing the differential amplifier circuit from outputting a false output when starting the circuit becomes necessary.

Comparative Example

Figure 1:
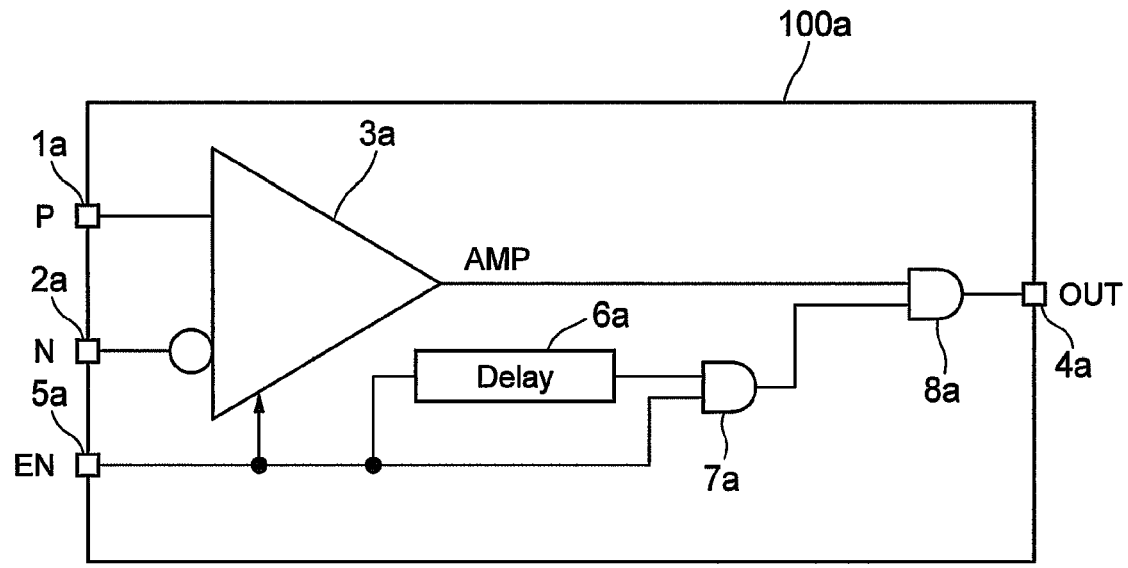
FIG. 1 is a circuit diagram showing an example of a circuit configuration of a semiconductor integrated circuit 100a which is a comparative example.

FIG. 1 is a circuit diagram showing an example of a circuit configuration of a semiconductor integrated circuit 100a which is a comparative example.

As shown in FIG. 1, the semiconductor integrated circuit 100a includes a non-inverting input terminal 1a, an inverting input terminal 2a, a differential amplifier circuit 3a, an enable signal input terminal 5a, a delay circuit 6a, an AND circuit 7a and an AND circuit 8a.

The delay circuit 6a provides an enable signal EN with a delay of a definite time period. The delay circuit 6a has a chain configuration obtained by connecting a plurality of inverters.

Figure 2:
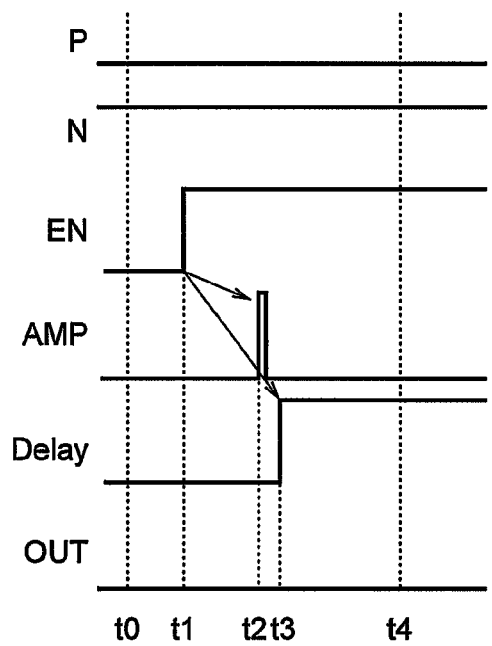
FIG. 2 is a waveform diagram showing an example of a voltage waveform at various points in the semiconductor integrated circuit 100a of the comparative example shown in FIG. 1.

FIG. 2 is a waveform diagram showing an example of a voltage waveform at various points in the semiconductor integrated circuit 100a of the comparative example shown in FIG. 1.

As shown in FIG. 2, the enable signal EN assumes a logic level "0" (0 V, "low" level) at time t0 (0 ns). It is now supposed that the differential amplifier circuit 3a is outputting the logic "0" according to a first input signal P and a second input signal N.

Then, the enable signal EN assumes a logic level "1" ("high" level) at time t1 (for example, 100 ns). At this time, a current is supplied to the differential amplifier circuit 3a and the circuit is started.

At certain time t2 (for example, 140 ns), the differential amplifier circuit 3a outputs a logic "1" which is a false signal depending upon conditions of operating points of MOS transistors in the circuit. However, the delay circuit 6a is outputting a logic "0." As a result, the semiconductor integrated circuit 100a outputs a logic "0" to the output terminal 4a.

Then, at time t3 (for example, 150 ns), the delay circuit 6a outputs a logic "1." At this time, MOS transistors included in the differential amplifier circuit 3a are already in stabilized states. As a result, the differential amplifier circuit 3a outputs a logic "0" according to the first input signal P and the second input signal N.

At time t4 (for example, 200 ns), the start time of the differential amplifier circuit 3a in the product becomes 100 ns.

Even if the differential amplifier circuit 3a falsely outputs a logic "1" ("high" level) at the time of circuit start, the semiconductor integrated circuit 100a outputs a logic "0" as a result of functions of the delay circuit 6a and the AND circuits 7a and 8a.

It is now supposed that the delay time of the delay circuit 6a is shorter than a predetermined time because of the condition of the manufacturing process, temperature and voltage.

Figure 3:
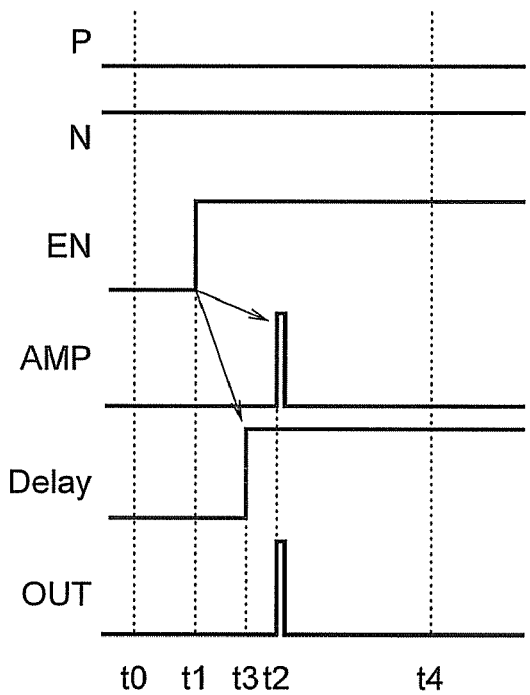
FIG. 3 is a waveform diagram showing another example of a voltage waveform at various points in the semiconductor integrated circuit 100a of the comparative example shown in FIG. 1.

FIG. 3 is a waveform diagram showing another example of a voltage waveform at various points in the semiconductor integrated circuit 100a of the comparative example shown in FIG. 1.

As shown in FIG. 3, the enable signal EN assumes a logic level "0" (0 V, "low" level) at time t0 (0 ns). It is now supposed that the differential amplifier circuit 3a is outputting the logic "0" according to the first input signal P and the second input signal N.

Then, the enable signal EN assumes a logic level "1" ("high" level) at time t1 (for example, 100 ns). At this time, a current is supplied to the differential amplifier circuit 3a and the circuit is started.

Then, at time t3 (for example, 130 ns) preceding time t2 when the differential amplifier circuit 3a outputs a logic "1," the delay circuit 6a outputs a logic "1."

At the time t2 (for example, 140 ns), the differential amplifier circuit 3a outputs a logic "1" which is a false signal depending upon conditions of operating points of MOS transistors in the circuit. At this time, the delay circuit 6a and the AND circuit 7a output a logic "1." As a result, the semiconductor integrated circuit 100a outputs a logic "1."

In other words, a problem that the false output at the time of start of the differential amplifier circuit 3a can be output to the output terminal 4a as it might be caused by dispersion of the delay time of the delay circuit 6a.

It is now supposed that the delay time of the delay circuit 6a is longer than a predetermined time because of the condition of the manufacturing process, temperature and voltage.

Figure 4:
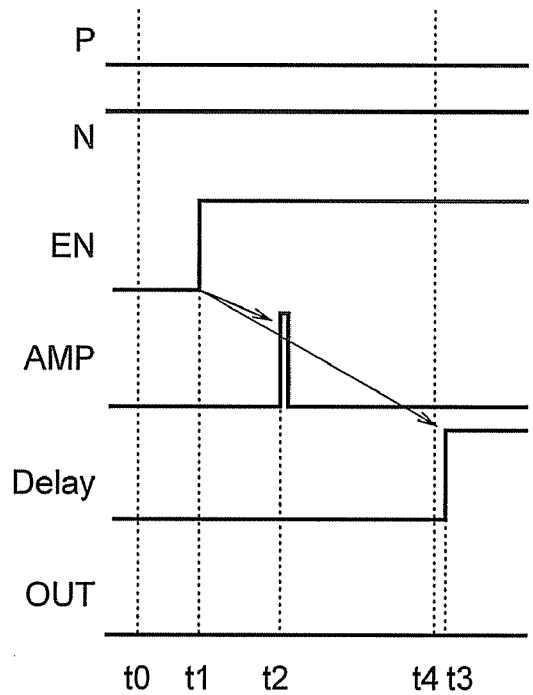
FIG. 4 is a waveform diagram showing still another example of a voltage waveform at various points in the semiconductor integrated circuit 100a of the comparative example shown in FIG. 1.

FIG. 4 is a waveform diagram showing still another example of a voltage waveform at various points in the semiconductor integrated circuit 100a of the comparative example shown in FIG. 1.

As shown in FIG. 4, the enable signal EN assumes a logic level "0" (0 V, "low" level) at time t0 (0 ns). It is now supposed that the differential amplifier circuit 3a is outputting the logic "0" according to the first input signal P and the second input signal N.

Then, the enable signal EN assumes a logic level "1" ("high" level) at time t1 (for example, 100 ns). At this time, a current is supplied to the differential amplifier circuit 3a and the circuit is started.

Then, at certain time t2 (for example, 150 ns), the differential amplifier circuit 3a outputs a logic "1" which is a false signal depending upon conditions of operating points of MOS transistors in the circuit. At this time, the delay circuit 6a is outputting a logic "0." As a result, the semiconductor integrated circuit 100a outputs a logic "0."

Then, at time t3 (for example, 210 ns), the delay circuit 6a outputs a logic "1."

In some cases, the start time of the circuit is specified to be 100 ns or less by specifications of the product. Even if in this case an effective signal is input to the differential amplifier circuit 3a, for example, at time t4, the semiconductor integrated circuit keeps outputting a logic "0" until, for example, 110 ns elapses.

This might pose a problem that the specifications of the start time of the product cannot be satisfied even if the circuit does not produce a false output.

In order to solve the above-described problem, a semiconductor integrated circuit according to the present invention will be described more specifically with reference to the drawings.

First Embodiment

Figure 5:
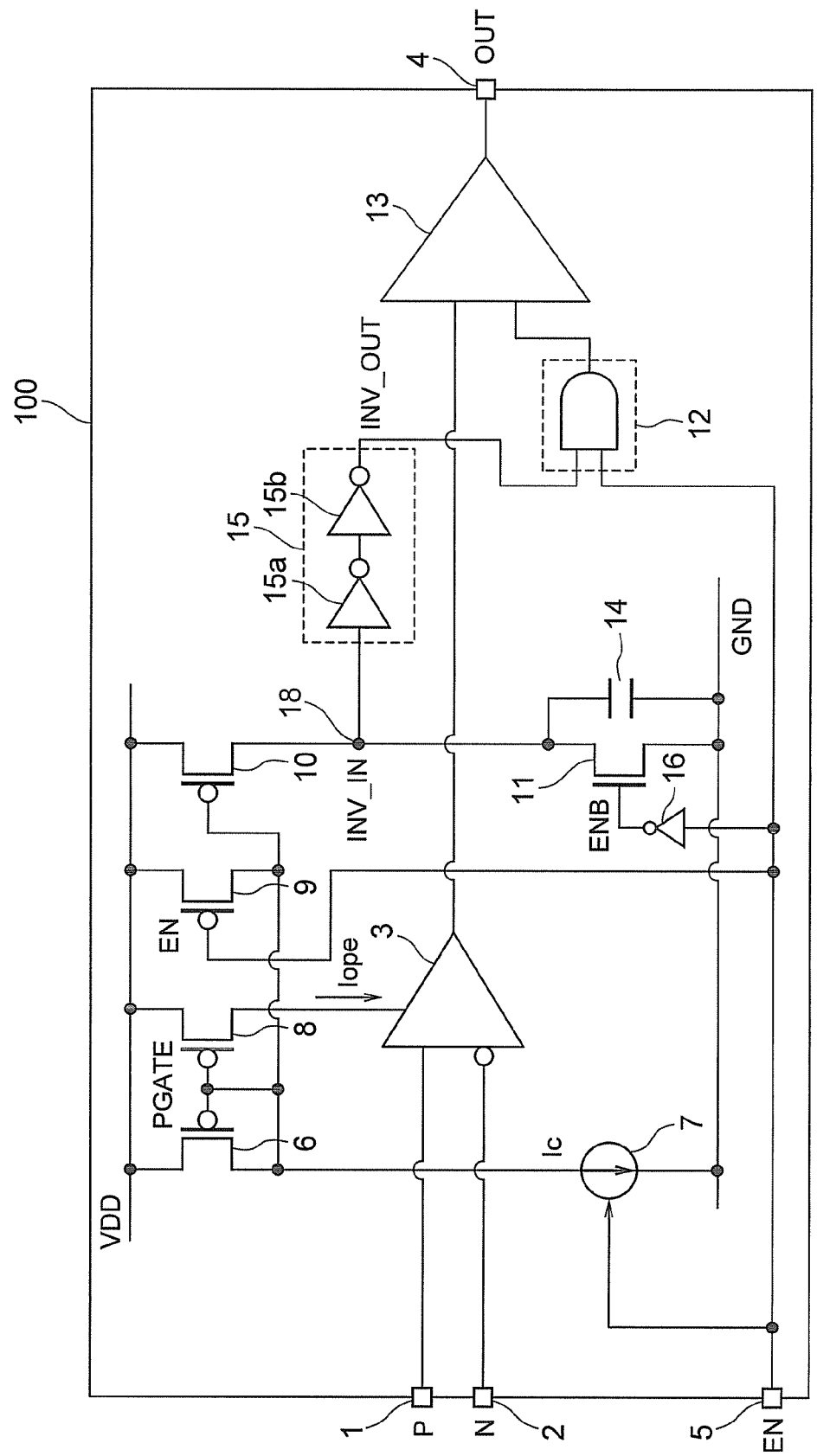
FIG. 5 is a diagram showing a configuration of a semiconductor integrated circuit 100 according to a first embodiment which is an aspect of the present invention.

FIG. 5 is a diagram showing a configuration of a semiconductor integrated circuit 100 according to a first embodiment which is an aspect of the present invention.

As shown in FIG. 5, the semiconductor integrated circuit 100 includes a non-inverting input terminal 1, an inverting input terminal 2, a differential amplifier circuit 3, an output terminal 4, an enable signal input terminal 5, a first MOS transistor 6, a constant current circuit 7, a second MOS transistor 8, a third MOS transistor 9, a fourth MOS transistor 10, a fifth MOS transistor 11, an operation circuit 12, an output buffer circuit 13, a capacitor 14, an inverter circuit 15 and an inverter 16.

The non-inverting input terminal 1 is adapted to be supplied with a first input signal (analog signal) P.

The inverting input terminal 2 is adapted to be supplied with a second input signal (analog signal) N obtained by inverting the phase of the first input signal P.

The differential amplifier circuit 3 is adapted to detect a potential difference between the first input signal P and the second input signal N and output an output signal depending upon a result of the detection. The differential amplifier circuit 3 is started by being supplied with an operation current, and its operation is stabilized after a predetermined time has elapsed.

The output terminal 4 is adapted to output an output signal OUT which is output from the output buffer circuit 13.

The enable signal input terminal 5 is adapted to be supplied with an enable signal EN.

The first MOS transistor 6 is a pMOS transistor connected at its first end (source) to a power supply VDD and diode-connected.

The constant current circuit 7 is connected between a second end (drain) of the first MOS transistor 6 and a ground GND.

The constant current circuit 7 is adapted to output a constant current Ic when the enable signal EN is at a first level ("high" level, for example, a power supply voltage (1.8 V)). Since the constant current circuit 7 outputs the constant current Ic, the current Ic flows through the first MOS transistor 6.

On the other hand, the constant current circuit 7 is adapted to stop to output the constant current Ic when the enable signal EN is at a second level ("low" level, for example, the ground voltage (0 V)) which is different from the first level.

Hereafter, it is supposed that, for example, the "high" level corresponds to the logic "1" and the "low" level corresponds to the logic "0."

The second MOS transistor 8 is a pMOS transistor connected at its first end (source) to the power supply VDD and connected at its second end (drain) to the differential amplifier circuit 3. Gates of the second MOS transistor 8 and the first MOS transistor 6 are connected together.

The second MOS transistor 8 is adapted to supply a current Iope, which is obtained by conducting a current mirror operation on the current Ic flowing through the first MOS transistor 6, to the differential amplifier circuit 3 as its operation current. Upon being supplied with this operation current, the differential amplifier circuit 3 is started.

The third MOS transistor 9 is a pMOS transistor connected at its first end to the power supply VDD. Second ends (drains) of the third MOS transistor 9 and the first MOS transistor 6 are connected together. The enable signal EN is input to the third MOS transistor 9 at its gate. The third MOS transistor 9 is adapted to be in the off-state when the enable signal EN is at the first level ("high" level) and be in the on-state when the enable signal EN is at the second level ("low" level).

The fourth MOS transistor 10 is a pMOS transistor connected at its first end (source) to the power supply VDD and connected at its gate to the second end of the first MOS transistor 6.

The fifth MOS transistor 11 is an nMOS transistor connected between a second end (drain) of the fourth MOS transistor 10 and the ground GND. An inverted signal ENB obtained by inverting the phase of the enable signal EN is input to the fifth MOS transistor 11 at its gate.

The fifth MOS transistor 11 is adapted to be in the on-state when the inverted signal ENB is at the first level ("high" level) and be in the off-state when the inverted signal ENB is at the second level ("low" level).

The inverted signal ENB is generated by, for example, inverting the phase of the enable signal EN in the inverter 16 connected between the enable signal input terminal 5 and the fifth MOS transistor 11 as shown in FIG. 5.

The operation circuit 12 is adapted to be supplied with a signal (a second voltage INV_OUT) depending upon a first voltage INV_IN at a node 18 between the fourth MOS transistor 10 and the fifth MOS transistor 11, and the enable signal.

The operation circuit 12 is adapted to output a first operation signal to output the output signal of the differential amplifier circuit 3 to the output terminal 4 when the enable signal EN is at the first level ("high" level) and the first voltage INV_IN is at least a prescribed voltage (for example, the power supply voltage (1.8 V)).

On the other hand, the operation circuit 12 is adapted to output a second operation signal when the enable signal EN is at the second level ("low" level) or the first voltage INV_IN is less than the prescribed voltage (for example, the ground voltage (0 V)).

The operation circuit 12 is an AND circuit which is supplied with the signal depending upon the first voltage INV_IN and the enable signal EN and which outputs the first operation signal or the second operation signal to the output buffer circuit 13. In this case, the first operation signal corresponds to the "high" level (logic "1") and the second operation signal corresponds to the "low" level (logic "0").

The output buffer circuit 13 is adapted to be supplied with the output signal of the differential amplifier circuit 3 and the signal output by the operation circuit 12.

The output buffer circuit 13 is adapted to output the output signal of the differential amplifier circuit 3 to the output terminal 4 when the first operation signal ("high" level, logic "1") from the operation circuit 12 is input to the output buffer circuit 13.

On the other hand, the output buffer circuit 13 outputs a signal fixed to a certain logic (for example, "0") to the output terminal 4, when the second operation signal ("low" level, logic "0") from the operation circuit 12 is input to the output buffer circuit 13.

The capacitor 14 is connected at its first end to a first end (drain) of the fifth MOS transistor, and connected at its second end to the ground GND. As a result, a change of the first voltage INV_IN at the node 18 can be controlled. In addition, susceptibility to influences of noise on the first voltage INV_IN can be lowered.

The inverter circuit 15 is connected on its input side to the node 18 and connected on its output side to an input of the operation circuit 12. The inverter circuit 15 is formed of a plurality of (here, an even number of) inverters 15a and 15b connected in series. The inverter circuit 15 is adapted to output the signal INV_OUT depending upon the first voltage INV_IN. The signal INV_OUT can be generated by shaping the waveform of the first voltage INV_IN in the inverter circuit 15.

An example of operation of the semiconductor integrated circuit 100 having the configuration heretofore described will now be described.

Figure 6:
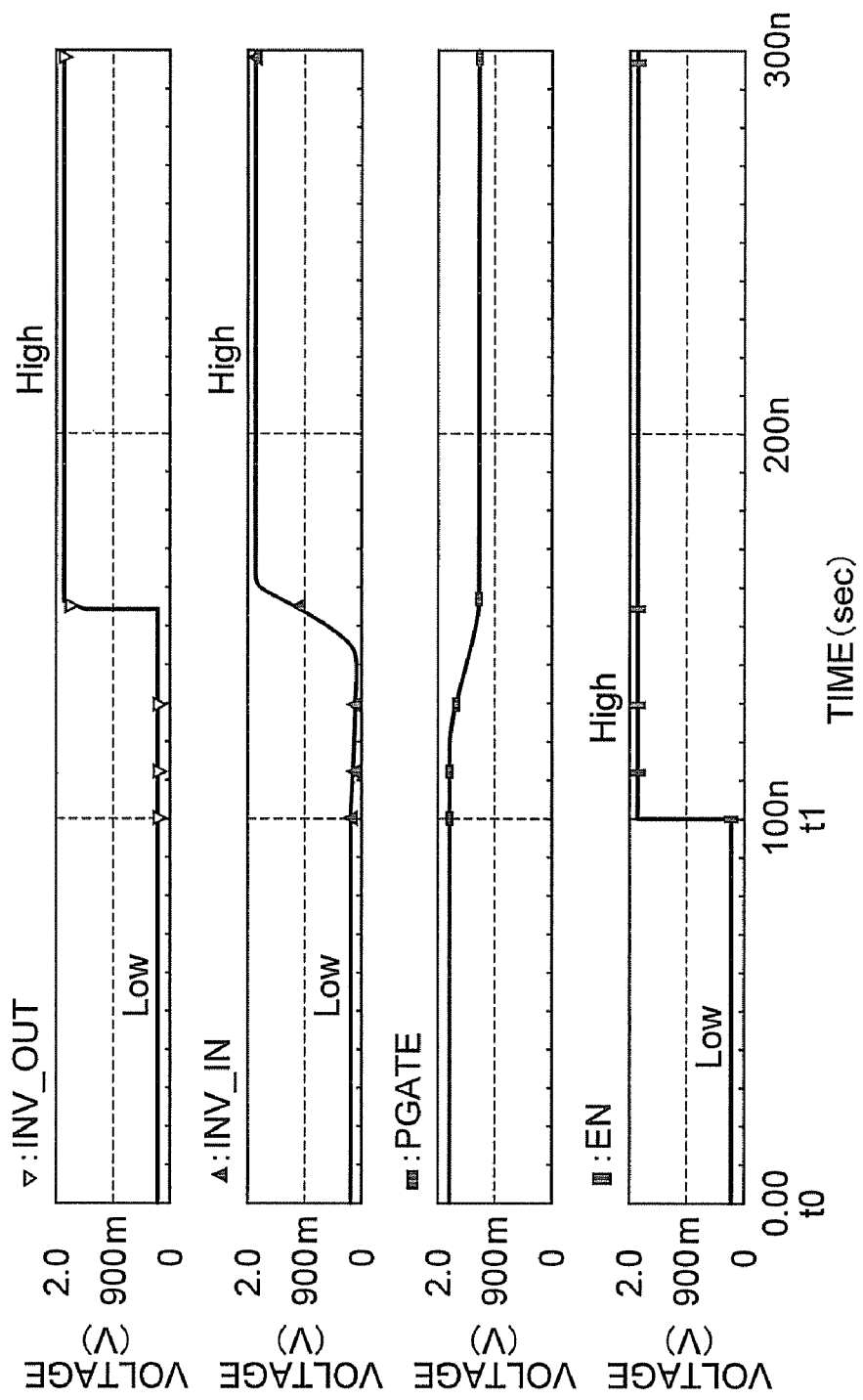
FIG. 6 is a waveform diagram showing an example of voltage waveforms at various points in the semiconductor integrated circuit 100 shown in FIG. 5.

FIG. 6 is a waveform diagram showing an example of voltage waveforms at various points in the semiconductor integrated, circuit 100 shown in FIG. 5. FIG. 6 shows plots of temporal changes of voltages, i.e., the enable signal EN, a gate voltage PGATE of the first MOS transistor 6, the first voltage (the input of the inverter circuit 15) INV_IN, and the second voltage (the output of the inverter circuit 15) INV_OUT.

As shown in FIG. 6, the enable signal EN is logic "0" (0 V, "low" level) at time t0 (0 ns). It is now supposed that the differential amplifier circuit 3 is outputting a logic "0" according to the first input signal P and the second input signal N.

As a result, a logic "1" (1.8 V, "high" level) is input to the gate of the fifth MOS transistor 11. Therefore, the first voltage INV_IN, which is input to the inverter circuit 15, is fixed near the ground voltage of 0 V by the drain of the fifth MOS transistor 11.

A logic "0" (0 V) is input to the gate of the third MOS transistor 9. Therefore, the gate voltage PGATE of the first MOS transistor 6 is fixed near the power supply voltage (1.8 V) by the drain of the third MOS transistor 9.

Then, at time t1 (100 ns), the enable signal EN becomes a logic "1" (1.8 V, "high" level). At this time, the constant current circuit 7 starts output of the constant current Ic. As a result, a current begins to flow through each of the first to fourth MOS transistors 6, 8, 9 and 10.

As a result, the operation current Iope is supplied to the differential amplifier circuit 3, and the differential amplifier circuit 3 is started.

The logic "1" of the enable signal EN is input to a first input of the operation circuit (AND circuit) 12. However, the output of the inverter circuit 15 which is input to a second input of the operation circuit 12 is kept at 0 V ("low" level, logic "0"). As a result, the output of the operation circuit (AND circuit) 12 is kept at the logic "0" (0 V, "low" level).

Even if the differential amplifier circuit 3 falsely outputs a logic "1," therefore, the output buffer circuit 13 keeps outputting the logic "0."

Then, a current is supplied to the gate of the first MOS transistor 6. As a result, the gate voltage PGATE gradually falls. Therefore, the fourth MOS transistor 10 turns on, and the fourth MOS transistor 10 begins to let a current flow.

Since the inverted signal ENB is a logic "0" (0 V, "low" level) at this time, the fifth MOS transistor 11 is in the off-state. If the fourth MOS transistor 10 begins to let the current flow, therefore, the first voltage INV_IN gradually rises and finally rises to the vicinity of the power supply voltage (1.8 V).

If the first voltage INV_IN exceeds a threshold potential of the inverter 15a in the inverter circuit 15, then the inverter 15a outputs a logic "0" ("low" level) and the inverter 15b in the subsequent stage outputs a logic "1" ("high" level). In other words, if the first voltage INV_IN becomes at least the prescribed voltage, then the inverter circuit 15 outputs a signal of a logic "1" ("high" level).

As a result, the operation circuit (AND circuit) 12 outputs a logic "1" in response to the logic "1" output by the inverter circuit 15 and the logic "1" of the enable signal EN.

Since the output of the operation circuit (AND circuit) becomes the logic "1," the output buffer circuit 13 outputs a signal which depends upon the output of the differential amplifier circuit 3.

As appreciated from FIG. 6, the operation circuit (AND circuit) 12 outputs a logic "1" ("high" level) after the gate voltage PGATE of the first MOS transistor 6, which functions as a current sink of the differential amplifier circuit 3, has begun to stabilize.

As already described, dispersion of the delay time of delay elements using the conventional inverter chain is not necessarily linked to dispersion of start time of the differential amplifier circuit.

In the present first embodiment, however, generation of a delay signal (rise of the first voltage INV_IN) is conducted by utilizing the gate voltage PGATE of the second MOS transistor 8, which functions as a current sink of the differential amplifier circuit 3. As a result, the problem that the delay signal becomes earlier than the start time of the differential amplifier circuit 3 is not posed.

As a result, it is possible to prevent the semiconductor integrated circuit 100 from outputting a false signal, which might be output when the differential amplifier circuit 3 is started, more certainly.

Therefore, it becomes unnecessary to start the differential amplifier circuit earlier than the delay time of the conventional inverter chain, and the current dissipation of the differential amplifier circuit can be suppressed.

The delay circuit of the conventional inverter chain is susceptible to influences of PVT (manufacturing process, power supply voltage and temperature). Then, the delay time of the delay circuit in the conventional inverter chain varies by, for example, the central value±approximately 40% due to the PVT. In other words, in the comparative example, specifications of the start time of the product cannot be satisfied as already described.

In general, however, the constant current circuit 7 in the semiconductor integrated circuit 100 is formed of, for example, a band gap reference circuit, which is little affected by the PVT, and the variation of the constant current of the constant current circuit 7 is small (for example, the central value±approximately 15%). In other words, in the semiconductor integrated circuit 100, specifications of the start time of the circuit can be shortened because the dispersion of the delay signal is small.

According to the semiconductor integrated circuit in the present embodiment, the output of the output signal of the differential amplifier circuit can be controlled more accurately as heretofore described.

Second Embodiment

In the first embodiment, an example of a configuration in which the first voltage INV_IN is output to the operation circuit 12 via the inverter circuit 15 in order to shape the waveform of the first voltage INV_IN has been described.

In a second embodiment, an example of a configuration including a Schmitt trigger circuit in order to reduce the influences exerted on the first voltage INV_IN will be described.

Figure 7:
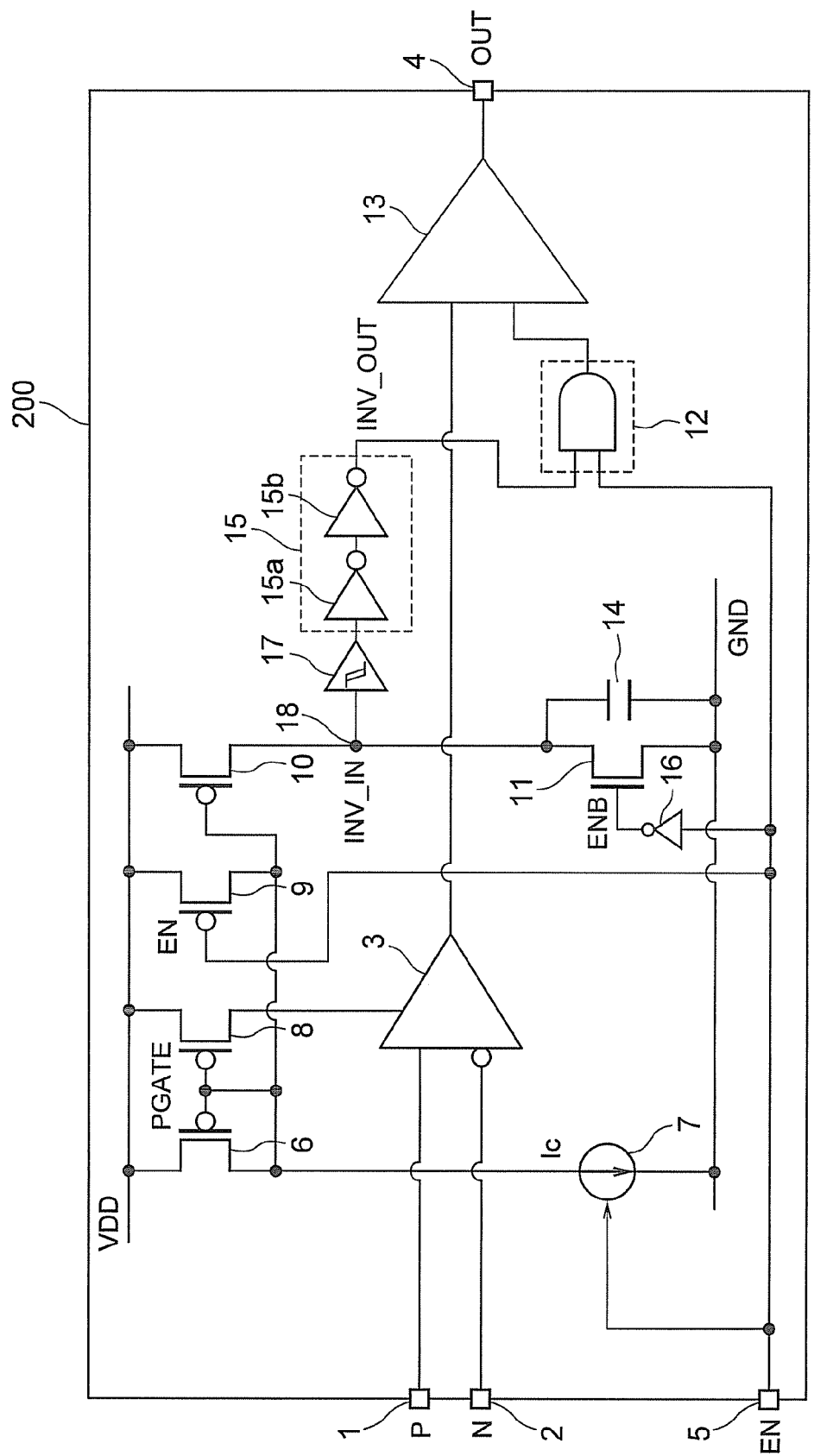
FIG. 7 is a circuit diagram showing a configuration of a semiconductor integrated circuit 200 according to a second embodiment which is an aspect of the present invention.

FIG. 7 is a circuit diagram showing a configuration of a semiconductor integrated circuit 200 according to a second embodiment which is an aspect of the present invention. In FIG. 7, components denoted by the same characters as those in FIG. 5 are components like those in the first embodiment.

As shown in FIG. 7, the semiconductor integrated circuit 200 further includes a Schmitt trigger circuit 17 as compared with the semiconductor integrated circuit 100 in the first embodiment.

The Schmitt trigger circuit 17 is connected at its input to the node 18, and the first voltage INV_IN is input to the Schmitt trigger circuit 17. The Schmitt trigger circuit 17 has hysteresis in threshold voltage. The Schmitt trigger circuit 17 is adapted to output a signal depending upon the first voltage INV_IN.

The inverter circuit 15 is connected on its input side to the output of the Schmitt trigger circuit 17 and connected on its output side to the input of the operation circuit 12. Therefore, the inverter circuit 15 outputs a signal depending upon the first voltage INV_IN.

In other words, a signal depending upon the output of the Schmitt trigger circuit 17 is input to the operation circuit 12.

It is now supposed that the first voltage INV_IN vibrates near the threshold of the inverter 15a in the subsequent stage due to the influence of power supply noise. As described above, however, the Schmitt trigger circuit 17 has hysteresis in the threshold voltage. Therefore, it is possible to prevent the influence of noise from being propagated to the inverter circuit 15.

Other operations of the semiconductor integrated circuit 200 are similar to those of the semiconductor integrated circuit 100 in the first embodiment.

In the semiconductor integrated circuit 200, therefore, it is possible to prevent a false signal, which might be output when the differential amplifier circuit 3 is started, from being output more certainly in the same way as the first embodiment. According to the semiconductor integrated circuit in the present embodiment, the output of the output signal of the differential amplifier circuit can be controlled more accurately as heretofore described.

Third Embodiment

In the first and second embodiments, examples of a semiconductor integrated circuit including a differential amplifier circuit have been described.

In a third embodiment, an example of a circuit configuration of the differential amplifier circuit in the semiconductor integrated circuit will be described.

Figure 8:
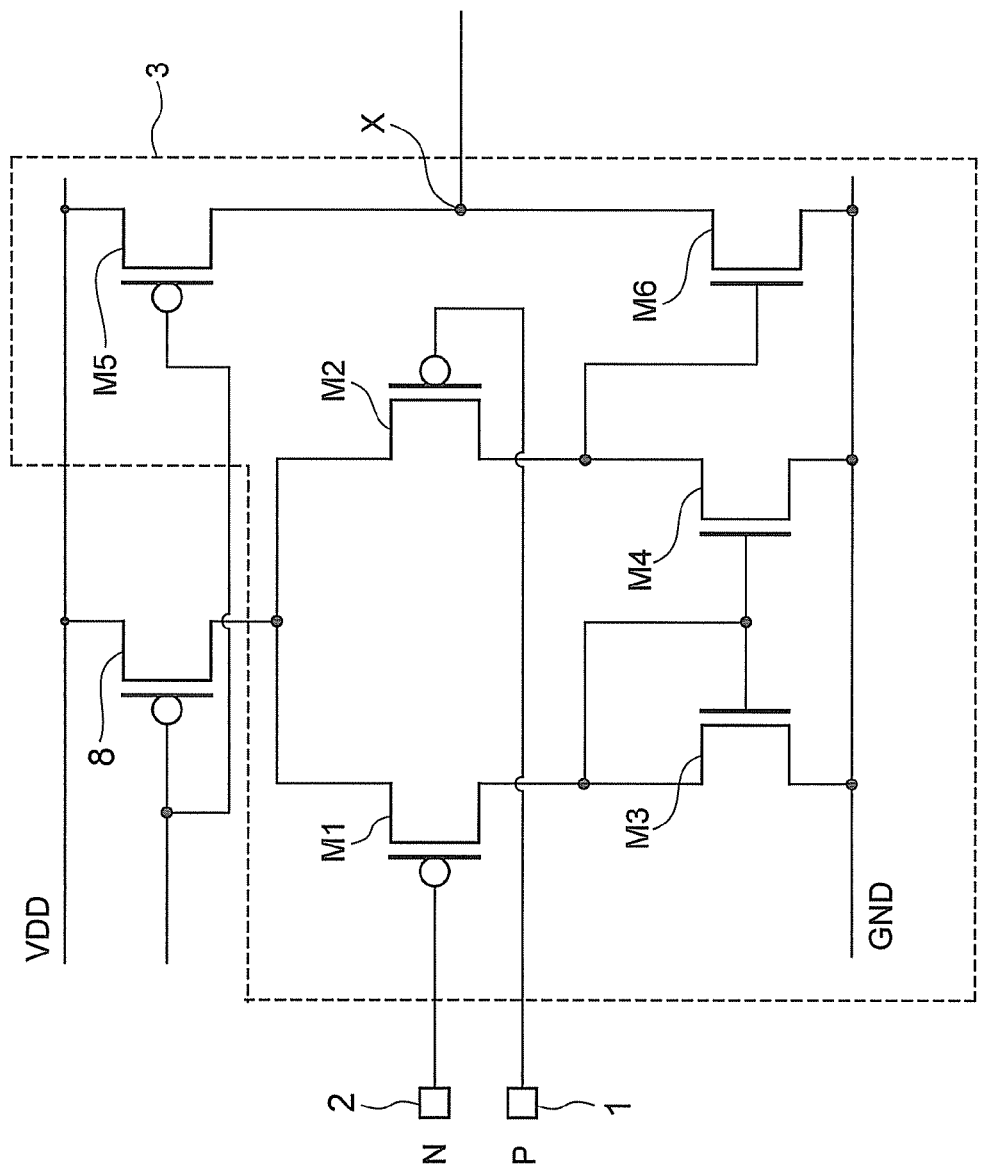
FIG. 8 is a diagram showing an example of a differential amplifier circuit 3 which can be applied to the semiconductor integrated circuits 100 and 200 respectively shown in FIGS. 5 and 7.

FIG. 8 is a diagram showing an example of a differential amplifier circuit 3 which can be applied to the semiconductor integrated circuits 100 and 200 respectively shown in FIGS. 5 and 7.

As shown in FIG. 8, the differential amplifier circuit 3 includes pMOS transistors M1, M2 and M5, and nMOS transistors M3, M4 and M6.

The pMOS transistor M1 is connected at its first end (source) to the second end (drain) of the second MOS transistor 8 and connected at its gate to the inverting input terminal 2.

The pMOS transistor M2 is connected at its first end (source) to the second end (drain) of the second MOS transistor 8 and connected at its gate to the non-inverting input terminal 1.

The nMOS transistor M3 is connected between a second end (drain) of the pMOS transistor M1 and the ground GND, and diode-connected.

The nMOS transistor M4 is connected between a second end (drain) of the pMOS transistor M2 and the ground GND. Gates of the nMOS transistor M3 and the nMOS transistor M4 are connected together.

The pMOS transistor M5 is connected at its first end (source) to the power supply VDD, and connected at its second end (drain) to a terminal x which functions as an output of the differential amplifier circuit 3. Gates of the pMOS transistor M5 and the second MOS transistor 8 are connected together.

The gate of the pMOS transistor M5 is connected to the gate of the first MOS transistor 6 as well. A current obtained by conducting mirroring on the current flowing through the first MOS transistor 6 is adapted to flow through the pMOS transistor M5.

The nMOS transistor M6 is connected between the terminal x and the ground GND, and connected at its gate to the second end (drain) of the pMOS transistor M2.

An example of operation of the differential amplifier circuit 3 having the configuration heretofore described will now be described.

If a value obtained by subtracting the potential of the second input signal N from the potential of the first input signal P is positive, then the nMOS transistor M6 turns off. As a result, the potential at the terminal x rises to the power supply voltage at the power supply VDD.

In other words, in this case, the differential amplifier circuit 3 outputs a signal of the "high" level.

On the other hand, if a value obtained by subtracting the potential of the second input signal N from the potential of the first input signal P is negative, then the nMOS transistor M6 turns on. As a result, the potential at the terminal x becomes the ground voltage at the ground GND.

In other words, in this case, the differential amplifier circuit 3 outputs a signal of the "low" level.

The differential amplifier circuit 3 having the function described heretofore is applied to the semiconductor integrated circuits 100 and 200 respectively in the first and second embodiments.

Fourth Embodiment

In the first to third embodiments, the semiconductor integrated circuits each including the differential amplifier circuit have been described.

In a fourth embodiment, an example of a configuration of an electronic device (for example, a portable telephone) to which the semiconductor integrated circuit is applied will be described. By the way, the electronic device in the present fourth embodiment may be another electronic device, such as a personal computer or a PDA, other than the portable telephone.

Figure 9:
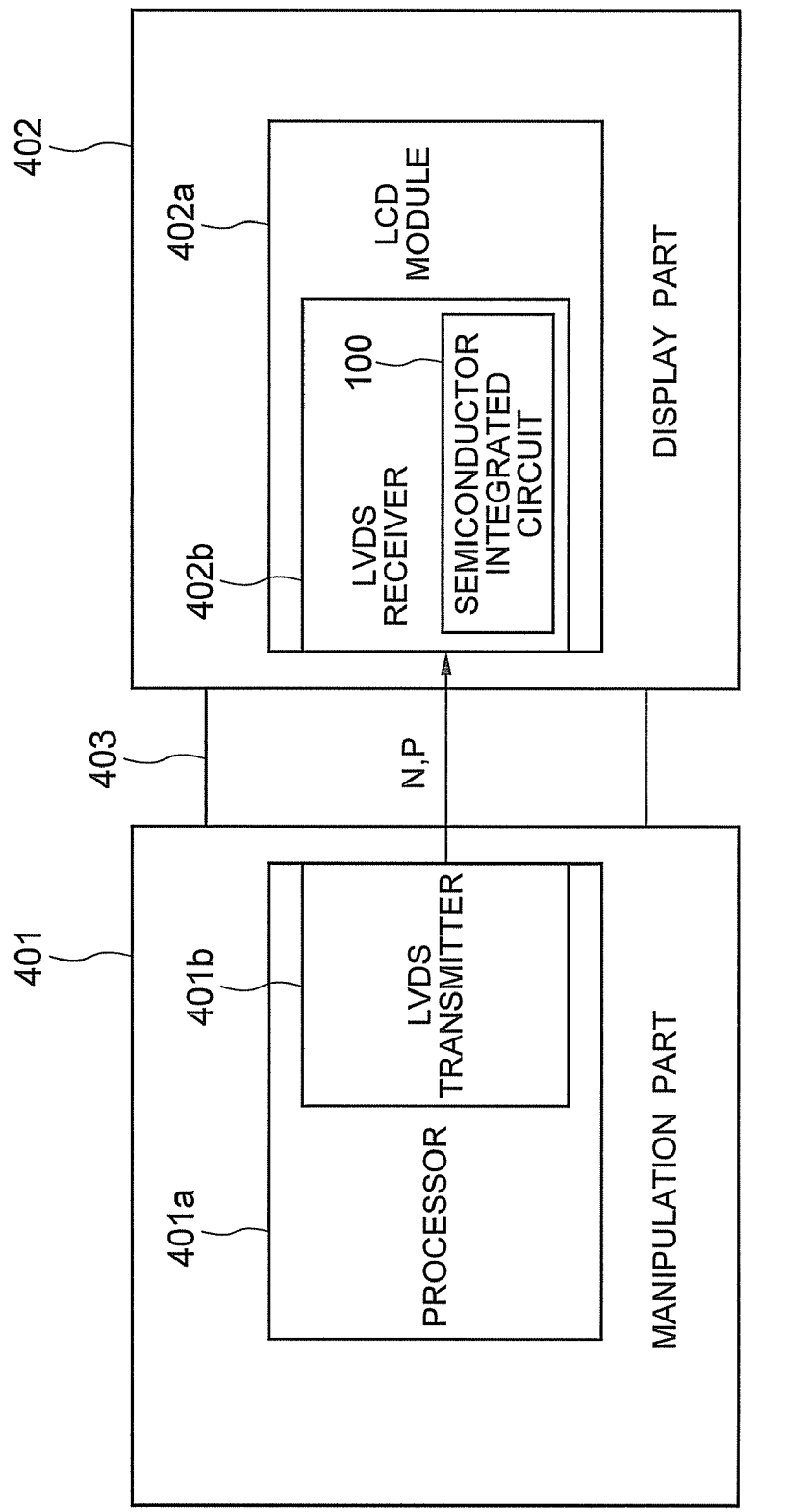
FIG. 9 is a block diagram showing an example of a configuration of an electronic device (portable telephone) 400 according to the fourth embodiment.

FIG. 9 is a block diagram showing an example of a configuration of an electronic device (portable telephone) 400 according to the fourth embodiment. FIG. 9 shows an example in which the semiconductor integrated circuit 100 shown in FIG. 5 is applied to the electronic device 400. However, the semiconductor integrated circuit 200 shown in FIG. 7 is also applied to the electronic device 400 in the same way.

As shown in FIG. 9, the electronic device 400 includes a manipulation part 401, a display part 402 and a connection part 403.

The connection part 403 connects the manipulation part 401 to the display part 402, and transmits signals between the manipulation part 401 and the display part 402.

The manipulation part 401 includes a processor 401a, which includes a LVDS (Low-Voltage Differential Signaling) transmitter 401b.

For example, a user manipulates the manipulation part 401. As a result, the processor 401a generates a control signal for controlling operation of the display part 402. This control signal includes a first analog signal (first input signal) P and a second analog signal (second input signal) N obtained by inverting the phase of the first analog signal P. The LVDS transmitter 401b outputs the generated control signal to the display part 402 via the connection part 403.

The display part 402 includes an LCD module 402a, which includes an LVDS receiver 402b.

The LVDS receiver 402b includes the semiconductor integrated circuit 100. The control signal (the first analog signal P and the second analog signal N) is input to the semiconductor integrated circuit 100 from the input terminals 1 and 2 (FIG. 5). The semiconductor integrated circuit 100 outputs a signal depending upon the control signal from the output terminal 4 (FIG. 5).

The LCD module 402a displays a predetermined image on a liquid crystal display (not illustrated) based on a signal which is output from the semiconductor integrated circuit 100.

In this way, the display part 402 displays the predetermined image based on the signal which is output from the semiconductor integrated circuit 100.

The semiconductor integrated circuit 100a in the comparative example might produce a false output.

If the semiconductor integrated circuit 100a in the comparative example is applied to the electronic device 400, then, the semiconductor integrated circuit 100a cannot output a predetermined signal accurately in response to, for example, a control signal for canceling the sleep state generated by the' processor 401a. As a result, the LCD module 402a cannot be started from the sleep state normally.

On the other hand, in the semiconductor integrated circuit 100, output of the output signal of the differential amplifier circuit can be controlled more accurately as already described.

In the electronic device (portable telephone) 100, therefore, the semiconductor integrated circuit 100 outputs a predetermined signal more accurately in response to, for example, the control signal for canceling the sleep state generated by the processor 401a. As a result, the LCD module 402a can be started from the sleep state normally.

According to the electronic device according to the present embodiment, desired operation can be attained more accurately as heretofore described.

What is claimed is:

1. A semiconductor integrated circuit comprising:
   a differential amplifier circuit which detects a potential difference between a first input signal and a second input signal obtained by inverting a phase of the first input signal, and outputs an output signal depending upon a result of the detection;
   a first MOS transistor of a first conductivity type connected at a first end thereof to a power supply and diode-connected;
   a constant current circuit connected between a second end of the first MOS transistor and a ground, outputting a constant current when an enable signal is at a first level, and stopping the output of the constant current when the enable signal is at a second level which is different from the first level;
   a second MOS transistor of the first conductivity type connected at a first end thereof to the power supply, connected at a second end thereof to the differential amplifier circuit, and connected at a gate thereof to a gate of the first MOS transistor to supply a current obtained by conducting current mirroring on a current flowing through the first MOS transistor as an operation current of the differential amplifier circuit;
   a third MOS transistor of the first conductivity type connected at a first end thereof to the power supply, connected at a second end thereof to the second end of the first MOS transistor, and supplied at a gate thereof with the enable signal to turn off when the enable signal is at the first level and turn on when the enable signal is at the second level;
   a fourth MOS transistor of the first conductivity type connected at a first end thereof to the power supply and connected at a gate thereof to the second end of the first MOS transistor;
   a fifth MOS transistor of a second conductivity type connected between the second end of the fourth MOS transistor and the ground and supplied at a gate thereof with an inverted signal obtained by inverting a phase of the enable signal to turn on when the inverted signal is at the first level and turn off when the inverted signal is at the second level;
   an operation circuit supplied with a signal depending upon a first voltage at a node between the fourth MOS transistor and the fifth MOS transistor and the enable signal, outputting a first operation signal to output the output signal of the differential amplifier circuit to an output terminal when the enable signal is at the first level and the first voltage is at least a prescribed voltage, and outputting a second operation signal when the enable signal is at the second level or the first voltage is lower than the prescribed voltage; and an output buffer circuit supplied with the output signal of the differential amplifier circuit and a signal output by the operation circuit, outputting the output signal to the output terminal when the first operation signal is input, and outputting a signal fixed to a certain logic to the output terminal when the second operation signal is input.

2. The semiconductor integrated circuit according to claim 1, further comprising
a capacitor connected at a first end to a first end of the fifth MOS transistor and connected at a second end thereof to the ground.

3. The semiconductor integrated circuit according to claim 1, further comprising
a Schmitt trigger circuit which is connected at an input thereof to the node and supplied with the first voltage and which has hysteresis in threshold voltage,
wherein a signal depending upon an output of the Schmitt trigger circuit is input to the operation circuit.

4. The semiconductor integrated circuit according to claim 2, further comprising
a Schmitt trigger circuit which is connected at an input thereof to the node and supplied with the first voltage and which has hysteresis in threshold voltage,
wherein a signal depending upon an output of the Schmitt trigger circuit is input to the operation circuit.

5. The semiconductor integrated circuit according to claim 1, further comprising
an inverter circuit connected on an input side thereof to the node, connected on an output side thereof to an input of the operation circuit, and formed of a plurality of inverters connected in series to output a signal depending upon the first voltage.

6. The semiconductor integrated circuit according to claim 1, wherein
the first level is a "high" level,
the second level is a "low" level that is lower than the "high" level, and
the operation circuit is an AND circuit supplied with a signal depending upon the first voltage and the enable signal to output the first operation signal or the second operation signal to the output buffer circuit.

7. The semiconductor integrated circuit according to claim 1, wherein the first to fourth MOS transistors are pMOS transistors and the fifth MOS transistor is a nMOS transistor.

8. The semiconductor integrated circuit according to claim 3, further comprising
an inverter circuit connected on an input side thereof to an output of the Schmitt trigger circuit, connected on an output side thereof to an input of the operation circuit, and formed of a plurality of inverters connected in series to output a signal depending upon the first voltage.

* * * * *